(12) United States Patent
Lauchner et al.

(10) Patent No.: US 6,796,625 B2
(45) Date of Patent: Sep. 28, 2004

(54) ONE-MOTION INSTALLATION SLIDE ASSEMBLY

(75) Inventors: Craig Lauchner, Mountain View, CA (US); Robert Hintz, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 21 days.

(21) Appl. No.: 10/241,793

(22) Filed: Sep. 10, 2002

(65) Prior Publication Data

US 2004/0047679 A1 Mar. 11, 2004

(51) Int. Cl.[7] .............................................. A47B 88/04
(52) U.S. Cl. ................... 312/334.46; 312/333; 403/329
(58) Field of Search .............................. 403/325, 322.1, 403/322.4, 321, 326, 327, 329, 330; 24/614–616; 312/333, 334.44, 334–46, 334.7; 384/21

(56) References Cited

U.S. PATENT DOCUMENTS

| | | | | |
|---|---|---|---|---|
| 3,589,778 A | * | 6/1971 | Olson | 384/21 |
| 3,650,578 A | * | 3/1972 | De Vecchio et al. | 384/18 |
| 4,998,828 A | * | 3/1991 | Hobbs | 384/18 |
| 5,417,490 A | * | 5/1995 | Hobbs et al. | 312/334.47 |
| 6,257,683 B1 | * | 7/2001 | Yang | 312/333 |
| 6,585,337 B1 | * | 7/2003 | Chen et al. | 312/334.46 |
| 2002/0081887 A1 | * | 6/2002 | Judge et al. | 439/348 |

* cited by examiner

Primary Examiner—James R. Brittain

(57) ABSTRACT

A one-motion installation slide assembly for bypassing a removably coupled locking connection of a first member of a slide with respect to a second member of the slide is disclosed. In one embodiment, the present invention is comprised of a first member and a second member removably coupled to the first member. The second member is adapted to provide a removably coupled locking connection with the first member such that during an initial coupling of the first member with the second member the removably coupled locking connection is bypassed.

18 Claims, 5 Drawing Sheets

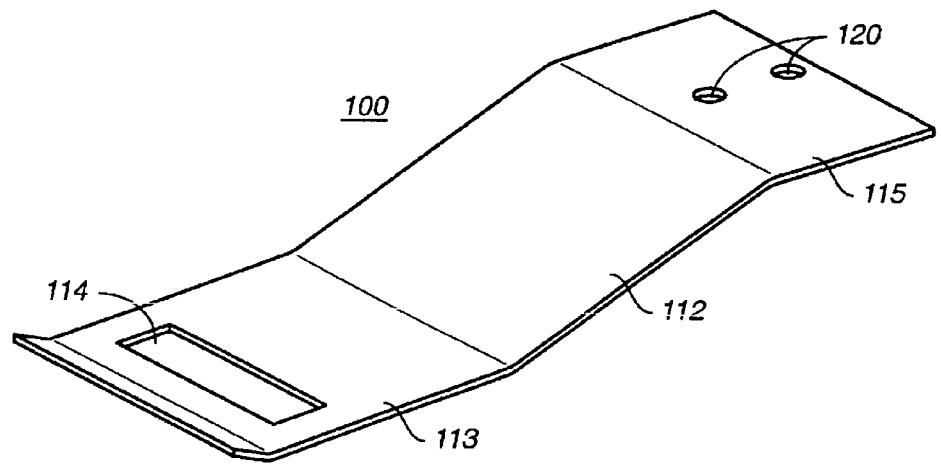
FIG._1A
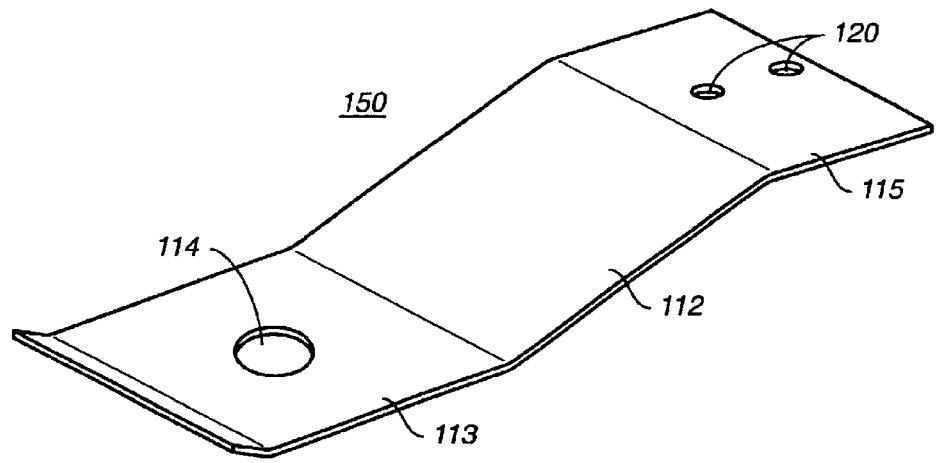
FIG._1B

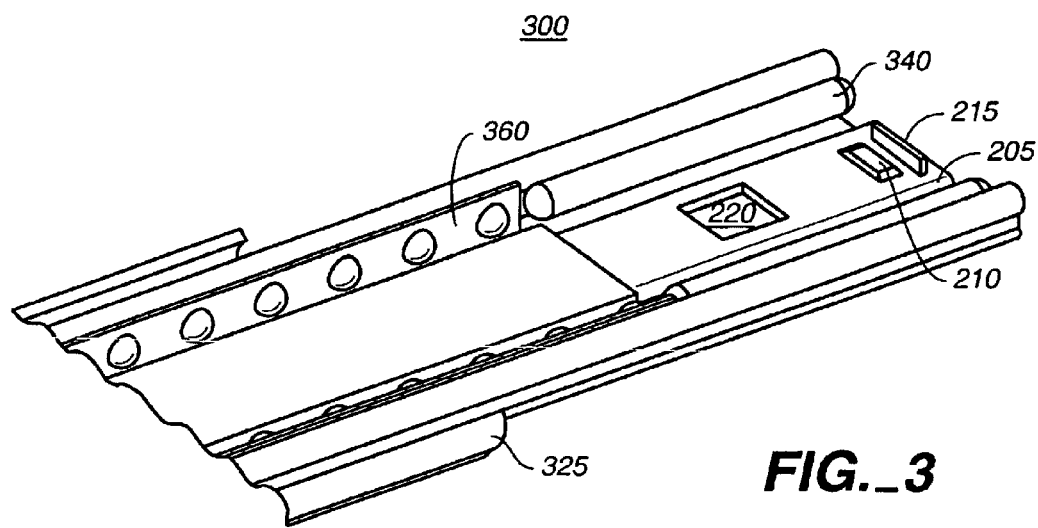
FIG._3
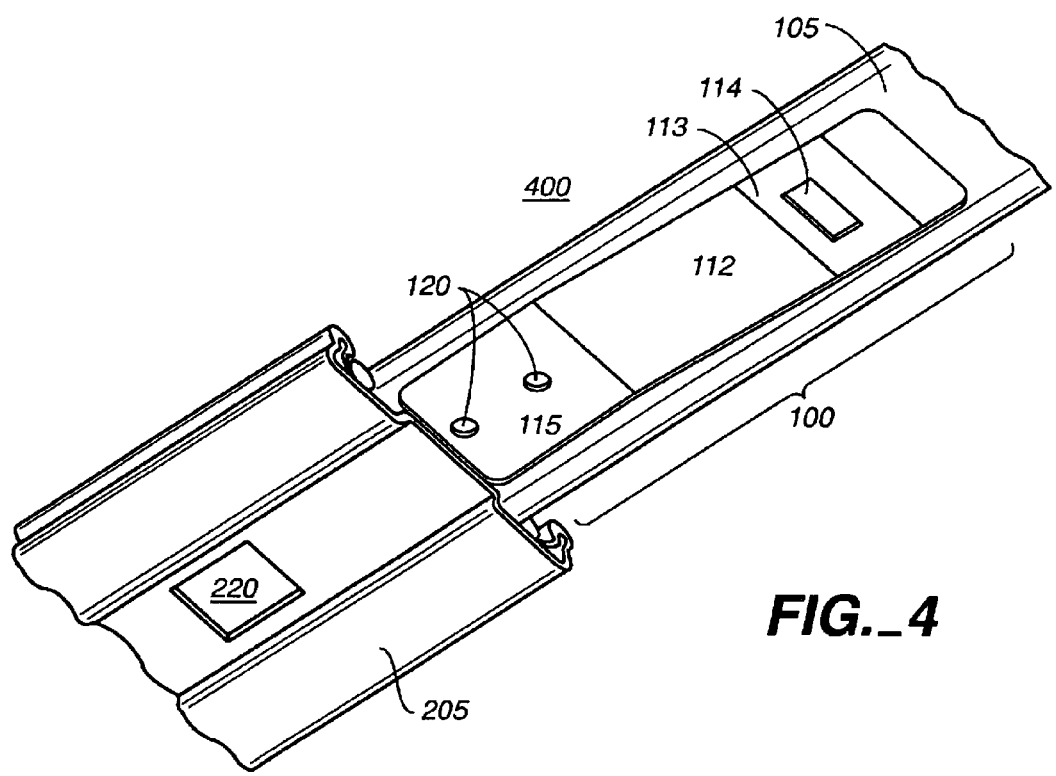
FIG._4

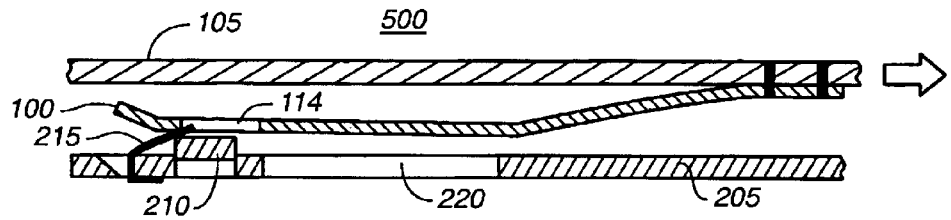
FIG._5A
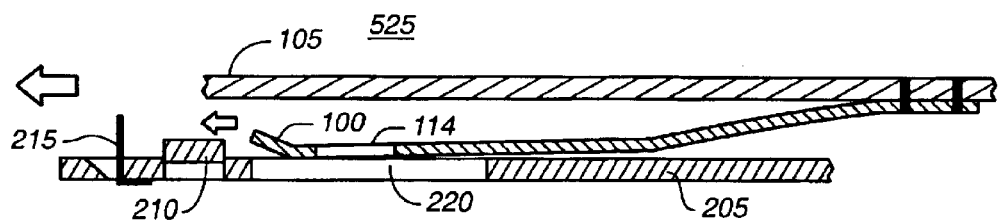
FIG._5B
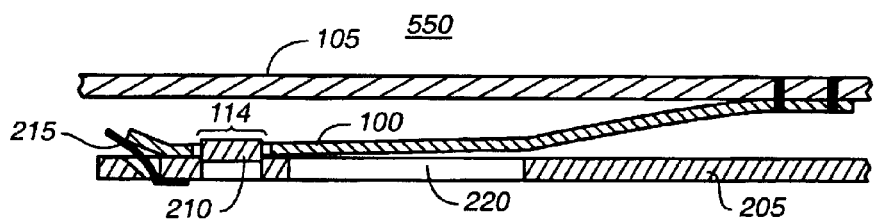
FIG._5C
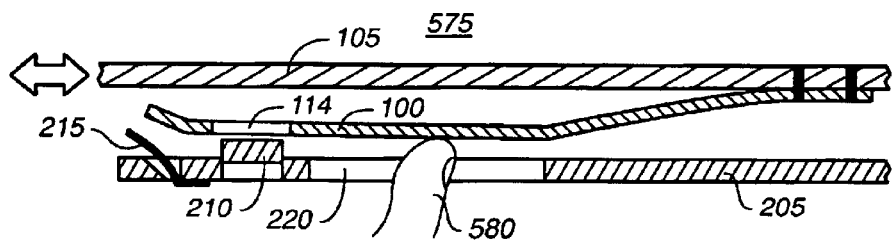
FIG._5D

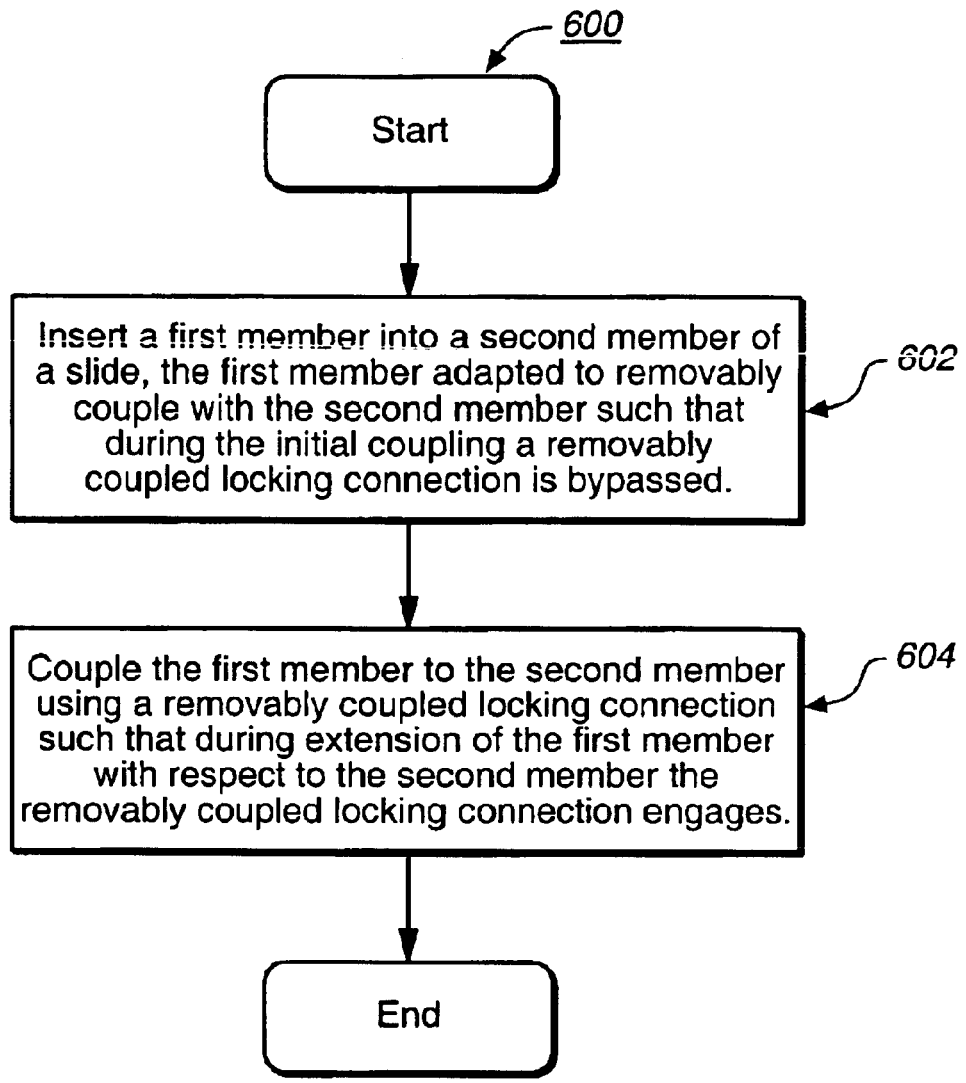
FIG._6

ONE-MOTION INSTALLATION SLIDE ASSEMBLY

TECHNICAL FIELD

The present claimed invention relates to the field of slide assemblies. More specifically, the present claimed invention relates to one-motion installation of a slide assembly.

BACKGROUND ART

Presently, slide assemblies are utilized as the mounting hardware between a component and the rack within which the component may be stored. For example, when the component is an electronic component such as a server, the use of a rack allows for a plurality of servers to be utilized with efficiency of storage, and convenience of accessibility. In many cases, the rack may have a back panel to which the electronic components can connect, thereby allowing the components to receive their power connections, network connections, phone connections, and the like.

In general, the use of slide assemblies allows for a simple way to hold a component or plurality of components within a rack which also offers convenient access. For example, when a slide assembly is used then the component may be slid completely into the rack during normal function and slid partially out of the rack for maintenance. Therefore, once the component is mounted within the rack, there is no need to remove the component from the rack. This type of slide assembly becomes very useful when the component is heavy, cumbersome, fragile, or the like. For example, if the component is a server which is extremely heavy, then instead of two or more technicians or power assisting machinery being required to perform routine maintenance on the server, a lone technician may simply slide the server partially out of the rack thereby gaining access to the server while allowing the rack to support the weight.

However, one deleterious effect of utilizing a slide assembly in conjunction with a rack is the possibility of the component held therewith being pulled to far out on the slide. In such a case, the weight of the component and the resulting moment caused by the increased distance between the component center of mass and that of the rack may cause a catastrophic failure. For example, the slide may be overextended during withdrawal of the component causing slide failure. Additionally, the overextension of the slide may cause the entire rack to tip over thereby damaging not only the component on the slide, but possibly any other components within the rack, the rack itself, and/or any technicians working in the area.

In order to ensure that an overextension of the slide does not occur, a safety feature is utilized by most slide manufacturers. The safety feature is a locking mechanism which allows the slide to be moved only a certain distance out from the rack. Therefore, when the component is withdrawn from the rack, it may only travel a certain distance before the movement of the slide is impeded. In most cases, the slide stoppage occurs well before the weight of the component can become a hazard to the slide, the rack, or the technician. Thus, the danger of a component falling from the rack or the rack falling over is minimized while easy access to the components stored within the rack is maintained.

If complete removal of the component from the rack is necessary, a technician may bypass the locking mechanism by disengaging the locking mechanism along the slide. For example, there may be a simple button to push or spring to move which then allows the slide to move past the locking mechanism and be removed from the rack.

However, the slide locking mechanism has a flaw which may be extremely hazardous. That is, during the installation of the component into the slide assembly, the locking mechanism engages. For example, when a technician initially inserts the component into the slide on the rack, before the slide or the rack may accomplish any load bearing or support of the component, the lock mechanism must be bypassed. Therefore, while supporting the weight of the component and while ensuring that the slide assembly is aligning itself correctly within the rack, the technician must also disengage the locking mechanism.

Thus, during the installation process more than one person is needed to ensure correct installation is accomplished with a minimization of damage. For example, during the installation of a component, one technician may be needed to support the weight of the component, correctly align the slide assembly, and insert the component into the rack, while a second technician may be needed to disengage the locking mechanism. Both technicians would need to work in conjunction in order not to damage the rack, the slide assembly, components already in the rack, and/or the component being placed in the rack.

Thus, the utilization of locking mechanisms during the installation process is not user friendly, is time-consuming, is cost associative, and lacks a desired "Design for Usability."

DISCLOSURE OF THE INVENTION

A one-motion installation slide assembly for bypassing a removably coupled locking connection of a first member of a slide with respect to a second member of the slide is disclosed. In one embodiment, the present invention is comprised of a first member and a second member removably coupled to the first member. The second member is adapted to provide a removably coupled locking connection with the first member such that during an initial coupling of the first member with the second member the removably coupled locking connection is bypassed.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 1A and 1B are perspective views of a first member of a one-motion installation slide assembly in accordance with embodiments of the present claimed invention.

FIG. 3 is a perspective view of a third member connectively coupled with a second member of a one-motion installation slide assembly in accordance with an embodiment of the present claimed invention.

FIG. 4 is a perspective view of a first member removably coupling with a second member of a one-motion installation slide assembly in accordance with an embodiment of the present claimed invention.

FIGS. 5A through 5D are side views of an exemplary coupling process of a first member of a one-motion installation slide assembly removably coupling with a second member of a one-motion installation slide assembly in accordance with an embodiment of the present claimed invention.

FIG. 6 is a flow chart of steps performed in accordance with one embodiment of the present claimed invention.

Figure 2A:
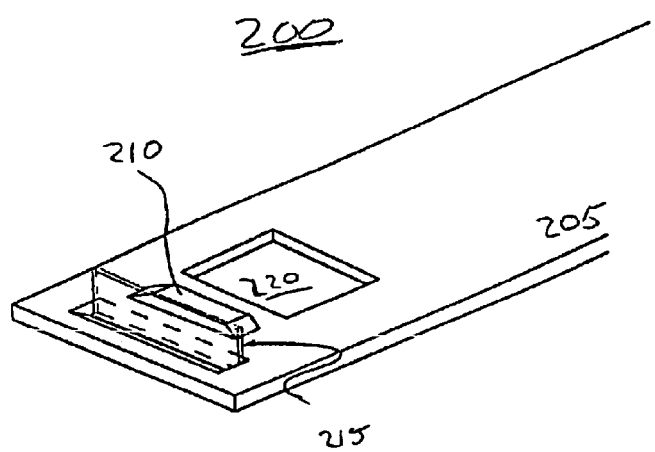
FIGS. 2A and 2B are perspective views of a second member of a one-motion installation slide assembly in accordance with embodiments of the present claimed invention.

The drawings referred to in this description should be understood as not being drawn to scale except if specifically noted.

BEST MODES FOR CARRYING OUT THE INVENTION

Reference will now be made in detail to embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

With reference now to FIGS. 1A and 1B, perspective views of a first member of a one-motion installation slide assembly are shown in accordance with embodiments of the present claimed invention. The following discussion will begin with a detailed description of the physical characteristics of the present one-motion installation slide assembly. The discussion will then contain a detailed description of the use and operation of the present one-motion installation slide assembly.

Regarding the physical structure of the first member of a one-motion installation slide assembly, for purposes of clarity, only one side of the spring portion (e.g., 100 and 150) is shown in FIGS. 1A and 1B. In one embodiment, spring portion (e.g., 100 and 150) may be attached to the inner slide portion of a telescoping quick disconnect slide (e.g., slide 105 of FIG. 4). As will be discussed herein in detail, in one embodiment (e.g., FIG. 1A), spring portion 100 may be coupled with first member 105 by a mounting system (e.g., 115 and 120 of FIGS. 1A and 1B). In addition, spring portion 100 may comprise a ramp portion 112. In one embodiment, ramp portion 112 may be a leaf spring. Furthermore, spring portion 100 may be manufactured from material such as plastic, stainless steel, plated spring steel, and spring steel. Although plastic, stainless steel, plated spring steel, and spring steel are mentioned herein, spring portion 100 may be made of any material capable of retaining a shape and having spring properties.

With reference now to FIG. 1A, ramp portion 112 includes an angled portion 113 at the end of ramp portion 112. It is appreciated that the thickness, length, angle, and material type of the ramp portion 112 may be varied. For example, the thickness of the ramp portion may be adjusted dependent on the weight requirements as defined by the load specification of the slide assembly.

With reference still to FIGS. 1A and 1B, in one embodiment spring portion (e.g., 100 and 150) also includes a mounting portion 115 integrated with ramp portion 112. Mounting portion 115 is employed to correctly position spring portion 100 with respect to a tab portion (e.g., 210 of FIGS. 2A and 2B). In one embodiment, mounting portion 115 of FIG. 1A may be the platform utilized by mounting system 120 to be coupled with first member 105. Mounting system 120 may utilize a rivet to be coupled with first member 105. In another embodiment, mounting system 120 may utilize a swage, spot-weld or epoxy to be coupled with first member 105. Although a plurality of mounting methods are shown, it is appreciated that the mounting method may be a combination of more than one of the above stated mounting methods.

With reference still to FIGS. 1A and 1B, in one embodiment spring portion 100 also includes a slot portion 114. Slot portion 114 is employed to couple with tab portion 210 of FIGS. 2A and 2B to provide a locking mechanism. In one embodiment, slot portion 114 may be a square hole. In another embodiment, slot portion 114 may be a circular hole. In general, slot portion 114 may be any of a plurality of shapes which may couple with tab portion 210 of FIGS. 2A and 2B.

Figure 2B:
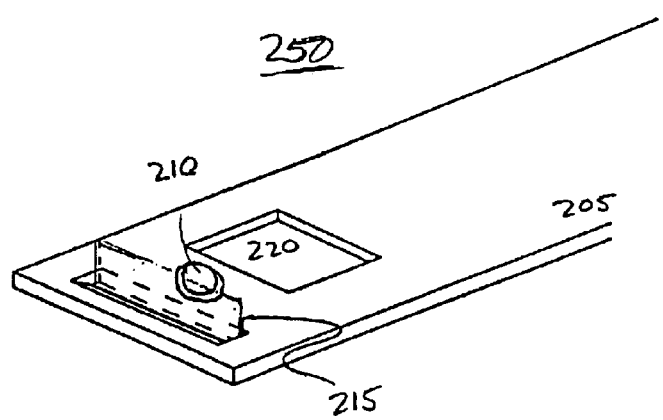

With reference now to FIGS. 2A and 2B, perspective views of a second member of a one-motion installation slide assembly are shown in accordance with embodiments of the present claimed invention. Regarding the physical structure of the second member of a one-motion installation slide assembly, for purposes of clarity, only one side of the second member (e.g., 205) is shown in FIGS. 2A and 2B. In one embodiment, second member 205 is a slide portion of a telescoping quick disconnect slide. In addition, second member 205 may be mounted to a rack, cabinet, wall, or the like. In another embodiment (as shown in FIG. 3), second member 205 may be coupled with (e.g., nested with) a third member 325. In one embodiment, third member 325 may be mounted to a rack, cabinet, wall, or the like. In that case, second member 205 may telescope allowing increased access to any component mounted thereon. Second member 205 includes a tab portion 210. Importantly, as will be discussed in detail below, tab portion 210 is a raised catch capable of stopping the motion of a first member (e.g., slot portion 114 of FIG. 1A). Furthermore, tab portion 210 may be any shape (e.g., rectangle, square, circle, or the like) and may be formed during the manufacture of second member 205, or tab portion 210 may be mounted on a pre-existing second member 205. For example, the tab portion 210 may be mounted using spot welding, a clip, rivets, screws, or the like. The plurality of possible mounting methods for the tab portion are not shown merely for purposes of brevity and clarity.

Referring again to FIGS. 2A and 2B, second member 205 also includes a release access portion 220 coupled with second member 205. Release access portion 220 is ultimately employed to allow a user access to first member 100 of FIG. 1A (or first member 150 of FIG. 1B). In one embodiment, release access portion 220 (of FIGS. 2A and 2B) is adapted to allow access to the removably coupled locking connection formed between tab portion 210 and slot portion (e.g., 114 of FIG. 1A), which will be discussed in more detail herein. Although release access portion 220 is specifically shown as separate from tab portion 210, release access portion 220 is also well suited to be coupled with tab portion 210. In addition, although release access portion 220 is shown as a square hole, it may be any shape hole which allows for finger or tool access. In another embodiment, release access portion 220 may be utilized in conjunction with a push button.

Referring still to FIGS. 2A and 2B, second member 205 also includes a bypass flap 215 coupled with second member 205. Bypass flap 215 may be used to allow first member 100 of FIG. 1A (or first member 150 of FIG. 1B) to initially pass beyond tab portion 210 without obstruction. Further actions of bypass flap 215 will be discussed in more detail herein. Although bypass flap 215 is specifically shown as separate from tab portion 210 of FIGS. 2A and 2B, bypass flap 215 is also well suited to be coupled with tab portion 210. In one embodiment, bypass flap 215 may be manufactured from a flexible material such as polypropylene, acetate, thin spring steel, or the like and may be attached to second member 205 via an adhesive material. In addition, although bypass flap 215 is shown as being made from a flexible material herein, it may be manufactured from any material which allows for a minimum of two way motion (e.g., a hinge and spring flap, or the like).

With reference now to FIG. 3, a perspective view of a third member connectively coupled with a second member of a one-motion installation slide assembly is shown in accordance with an embodiment of the present claimed invention. For example, assembly 300 illustrates the coupling of outer slide member 325 and second member 210 (including ball retainer 360, and lead-ins 340). Although an outer member (e.g., 325) is shown, second member 205 is well suited to act as an outer member 325.

As illustrated in FIG. 4, a perspective view of a first member removably coupling with a second member of a one-motion installation slide assembly is shown in accordance with an embodiment of the present claimed invention. Specifically, first member 105 is shown nesting within second member 205 thus correctly positioning spring portion 100 with regard to tab portion 210.

With reference now to FIGS. 5A through 5D side views of an exemplary coupling process of a first member of a one-motion installation slide assembly removably coupling with a second member of a one-motion installation slide assembly are shown in accordance with an embodiment of the present claimed invention. In general, FIGS. 5A through 5D illustrate a removably coupled locking connection between slot portion 114 and tab portion 210. For example, during an initial coupling of first member 105 with second member 205 the removably coupled locking connection is bypassed, but subsequent extension of first member 105 with respect to second member 205 will result in the locking connection being engaged.

The following is a detailed description of the use and operation of the present one-motion installation slide assembly. With reference now to FIG. 4, in one embodiment, first member 105 is integrated with second member 205. For example, first member 105 may be the inner slide of a telescoping quick disconnect slide assembly and second member 205 may be either the outer slide (or the middle slide if a third slide is utilized (e.g., 325 as shown in FIG. 3)) of a telescoping quick disconnect slide assembly. Therefore, first member 105 may be removably coupled with second member 205. It is appreciated that only a portion of both first member 105 and second member 205 are shown in the present embodiments.

Importantly, in one embodiment, slide assembly 400 may be utilized in conjunction with a rack and a component (e.g., a server) to be stored in the rack. For example, first member 105 may be removably coupled with the component to be stored in the rack. That is, first member 105 may be coupled to the side of the component (or the top, or the corner, or the like). In addition, second member 205 may be coupled to the rack (via mounting second member 205 directly to the rack or by mounting third member 325 of FIG. 3 to the rack and having second member 205 coupled thereon). Once second member 205 is secure in the rack and first member 105 is coupled to the component, first member 105 may then be removably coupled with second member 205 thereby establishing a complete slide assembly.

However, the present embodiment does not lock the slide during the initial coupling of the first member 105 with the second member 205. Instead, due to spring portion 100 and slot portion 114 mounted on first member 105 and bypass flap 215, the initial lockout of the slide is bypassed. In addition, the present embodiment does not require a user or technician to manually set the removably coupled locking connection after the initial installation. Instead, the present embodiment allows customers and technicians to realize the beneficial one-motion installation while also establishing an automatic slide lock.

With reference now to FIGS. 5A through 5D, one embodiment of an exemplary coupling process of the coupling of first member 105 with second member 205 is shown. Specifically, with reference to FIG. 5A, second member 205 is comprised of tab portion 210, bypass flap 215, and access portion 220. First member 105 is comprised of spring portion 100 and a slot portion 114.

Referring now to FIG. 5A, first member 105 and second member 205 are shown upon initial installation wherein the removably coupled locking connection is being bypassed. In one embodiment, during installations of first member 105, bypass flap 215 folds over a portion of tab portion 210 thereby allowing slot portion 114 to pass over tab portion 210 and bypass the removably coupled locking connection. In addition, the ramp portion (e.g., 112 of FIG. 4) is shown as it compresses to pass tab portion 210. Therefore, first member 105 slides freely along second member 205 during the initial installation.

Referring now to FIG. 5B, tab portion 210 and spring portion 100 are shown after initial installation (and possibly during an extraction process) wherein the removably coupled locking connection may now be engaged. In addition, the ramp portion (e.g., 112 of FIG. 4) is shown after it has compressed to pass tab portion 210 and sprung back into its original shape. Thus, slide assembly 550 has been assembled and a concurrently coupled locking connection may be established between first member 105 and second member 205 without the requirement of any additional assembly steps or user interaction.

With reference now to FIG. 5C, spring portion 100 is shown establishing a removably coupled locking connection with tab portion 210. For example, when first member 105 is partially telescoped out from second member 205 (e.g., for maintenance, establishing new connections, complete removal, or the like) slot portion 114 and tab portion 210 will establish a removably coupled locking connection. The removably coupled locking connection will stop the motion of first member 105 with respect to second member 205, thereby protecting the component held therein, the rack, and/or the user or technician working thereon from the hazards associated with a non-locking slide assembly. For example, as slide assembly 550 begins to telescope spring portion 100 will compress as angular portion 113 contacts tab portion 210 to allow spring portion 100 to pass over tab portion 120. However, when slot portion 114 passes over tab portion 120, spring portion 100 will decompress thereby locking slot portion 114 with tab portion 120. Therefore, further motion (e.g., in both the removing and inserting directions) of first member 105 with respect to second member 205 will be stopped. Furthermore, by locking the two slides into an open position, a technician may work on the component held by slide assembly 550 without the undesirable action of the component sliding back and forth within the slide assembly.

With reference now to FIG. 5D, slide assembly 575 is shown with release access portion 220 being accessed by a device 580 in order to disconnect the removably coupled locking connection. For example, the locking connection holding first member 105 from being decoupled from (or reinstalled with) second member 205 may be disengaged by depressing spring portion 100 utilizing device 580. In one embodiment, device 580 may be a finger, a tool, or any other device which may fit through release access portion 220 and depress spring portion 100. Once spring portion 100 is depressed, first member 105 will again slide freely with respect to second member 205 in either the assembled direction or the removed direction.

With reference now to FIG. 6, a flow chart 600 summarizing the steps performed in accordance with one embodiment of the present invention is shown. At step 602, the present embodiment inserts a first member into a second member of a slide assembly. In addition, during the initial coupling a removably coupled locking connection is bypassed. As described in detail herein, the removably coupled locking connection (e.g. spring portion 100 and tab portion 210) is adapted to provide a removably coupled locking connection between second member (e.g., 205 of FIG. 5) and first member (e.g., 105 of FIG. 5) such that during installation, a further step of disengaging the safety locking mechanism between first member 105 and second member 205 is not required.

Next, at step 604, the present embodiment couples the first member to the second member using a removably coupled locking connection such that during extension of the first member with respect to the second member the removably coupled locking connection engages. Beneficially, the present embodiment eliminates the need to manually engage the locking mechanism between second member (e.g., 205 of FIG. 5) and first member (e.g., 105 of FIG. 5). Instead, the present embodiment allows slide assemblies to be assembled without concern for the subsequent locking connection being manually established. Furthermore, with the ability to mount both spring portion 100 and tab portion 210 on pre-existing slide assemblies negate the need for replacement of slide assemblies already in use.

Thus, embodiments of the present invention provide a one-motion installation slide assembly method and apparatus which bypasses the slide locking mechanism during installation. The one-motion installation slide assembly method and apparatus achieves the above accomplishment and also provides a reliable slide locking mechanism during the subsequent extraction of the slide assembly while also significantly reducing assembly procedures and personnel requirements. In addition, it can be adapted to readily interface with industry standard components and meet industry standard specifications.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A one-motion installation slide assembly comprising:
   a first member comprising:
      a spring portion; and
      a slot portion; and
   a second member removably coupled to said first member, said second member adapted to provide a removably coupled locking connection with said first member such that during an initial coupling of said first member with said second member said removably coupled locking connection is bypassed, said second member comprising:
      a tab portion adapted to provide a removably coupled locking connection with said slot portion of said first member; and
      a bypass flap portion adapted to selectively cover said tab portion such that during an initial coupling of said first member with said second member, said slot portion of said first member passes said tab portion of said second member such that said removably coupled locking connection is bypassed.

2. The one-motion installation slide assembly of claim 1 wherein said spring portion is comprised of:
   a ramp portion to compress and pass said tab portion of said second member with respect to said first member such that said first member slides freely along said second member; and
   a mounting portion integrated with said ramp portion, said mounting portion adapted to be coupled with said first member.

3. The one-motion installation slide assembly of claim 2 wherein said ramp portion is a leaf spring selected from the group of materials consisting of stainless steel, spring steel and spring steel plating.

4. The one-motion installation slide assembly of claim 2 wherein said mounting portion is coupled with said first member by a mounting system selected from the group of materials consisting of screw, spot weld, rivet, tabs, swaging and epoxy.

5. The one-motion installation slide assembly of claim 1 wherein said tab portion of said second member is comprised of a catch capable of stopping the motion of said first member.

6. The one-motion installation slide assembly of claim 1 wherein said first member and said second member are portions of a telescoping quick disconnect slide.

7. The one-motion installation slide assembly of claim 1 further comprising:
   a release access portion coupled with said second member, said release access portion adapted to allow access to said removably coupled locking connection.

8. The one-motion installation slide assembly of claim 1 further comprising:
   a third member which mounts to a rack, said third member connectively coupled with said second member.

9. A method for bypassing a removably coupled locking connection of a first member of a slide with respect to a second member of said slide comprising:
   a) inserting a first member into a second member of a slide, said first member adapted to removably couple with said second member such that during the initial coupling a removably coupled locking connection is bypassed, said first member having a spring portion and a slot portion adapted to provide a removably coupled lock connection with a tab portion of said second member, wherein said tap portion is selectively covered with a bypass flap portion such that during an initial coupling of said first member with said second member, said slot portion of said first member passes over said tab portion of said second member; and
   b) coupling said first member to said second member using a removably coupled locking connection such that during extension of said first member with respect to said second member said removably coupled locking connection engages.

10. The method as recited in claim 9 wherein said step a) comprises inserting said first member into said second member wherein said first member is removably coupled with said second member to form a telescoping quick disconnect slide.

11. The method as recited in claim 9 wherein said spring portion is a leaf spring manufactured from the group of materials consisting of stainless steel, spring steel, and spring steel plating.

12. The method as recited in claim 9 wherein a mounting portion is coupled with said first member by a mounting system selected from the group of materials consisting of screw, spot weld, rivet, tabs, swaging and epoxy.

13. A one-motion installation slide assembly comprising:
   a first member having a spring portion and a slot portion; and
   a second member removably coupled to said first member, said second member having a catch portion adapted to provide a removably coupled locking connection with said slot portion of said first member, said second member further having a bypass flap portion, said bypass flap portion adapted to selectively cover said catch portion such that during an initial coupling of said first member with said second member, said slot portion of said first member passes said catch portion of said second member such that said removably coupled locking connection is bypassed, said spring portion comprised of:

a ramp portion to compress and pass said catch portion of said second member during coupling of said first member with said second member such that said first member slides freely along said second member; and a mounting portion integrated with said ramp portion, said mounting portion adapted to be coupled with said first member.

14. The one-motion installation slide assembly of claim 13 wherein said first member and said second member are portions of a telescoping quick disconnect slide.

15. The one-motion installation slide assembly of claim 13 further comprising:

a release access portion coupled with said second member, said release access portion adapted to allow access to said removably coupled locking connection.

16. The one-motion installation slide assembly of claim 13 wherein said catch portion is capable of stopping the motion of said first member.

17. The one-motion installation slide assembly of claim 13 wherein said spring portion is a leaf spring selected from the group of materials consisting of stainless steel, spring steel, and spring steel plating.

18. The one-motion installation slide assembly of claim 13 wherein said mounting portion is coupled to said first member such that said ramp portion is compressed by said bypass flap portion of said second member during the initial removably coupling thereof.

* * * * *